(12) United States Patent
Takahashi et al.

(10) Patent No.: US 7,361,967 B2
(45) Date of Patent: Apr. 22, 2008

(54) SEMICONDUCTOR DEVICE WITH FUSE WIRES AND CONNECTION WIRES

(75) Inventors: Hiroyuki Takahashi, Kawasaki (JP);
Masayuki Yanagisawa, Kawasaki (JP);
Masatoshi Sonoda, Kawasaki (JP);
Yoshinori Ueno, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/050,708

(22) Filed: Feb. 7, 2005

(65) Prior Publication Data
US 2005/0181680 A1 Aug. 18, 2005

(30) Foreign Application Priority Data
Feb. 12, 2004 (JP) .............................. 2004/035245

(51) Int. Cl.
*H01L 29/00* (2006.01)
(52) U.S. Cl. ............... 257/529; 257/209; 257/E23.149; 438/132
(58) Field of Classification Search ................ 257/209, 257/529, E23.149; 438/132
See application file for complete search history.

(56) References Cited

U.S. PATENT DOCUMENTS 6,900,516 B1 * 5/2005 Banisch et al. ............. 257/529
7,061,070 B2 * 6/2006 Ikegami ...................... 257/529

FOREIGN PATENT DOCUMENTS

| JP | 2002-368094 | 12/2002 |
| JP | 2003-142582 | 5/2003 |

* cited by examiner

*Primary Examiner*—Howard Weiss
*Assistant Examiner*—John C Ingham
(74) *Attorney, Agent, or Firm*—Young & Thompson

(57) ABSTRACT

A semiconductor device wherein return wires corresponding to a plurality of fuse wires are arranged collectively in the same region. Moreover, the return wires are arranged in multiple layers. This arrangement creates a region where no return wire is disposed between the fuse wires, thereby permitting an arrangement of the fuse wires at the minimum wiring pitch. Alternatively, the semiconductor device may include fuse strings arranged in a plurality of stages and a plurality of connection wires for supplying signals to the fuse strings in the plurality of stages, respectively, wherein connection wires for other fuse strings are arranged in a region between adjacent fuse strings.

11 Claims, 6 Drawing Sheets

PRIOR ART

PRIOR ART

SEMICONDUCTOR DEVICE WITH FUSE WIRES AND CONNECTION WIRES

BACKGROUND OF THE INVENTION

1. Field of the Invention

The present invention relates to a semiconductor device, and more particularly to a fuse circuit.

2. Related Background Art

A semiconductor memory such as a DRAM has a redundant circuit for replacing a defective memory with a redundant memory. The circuit has a program circuit for storing an address of the redundant memory. If any defective cell exists, the address of the defective cell is programmed in the LSI, so that the redundant cell is accessed at the time of access with the address during the LSI operation. The redundant circuit has a program element (fuse) formed of polysilicon or aluminum wiring. The replacement address programming is conducted by blowing the fuse using a laser device.

There has been suggested a fuse circuit having an arrangement wherein circuit blocks for determining a replacement address are disposed on one side of a fuse area and return wires are used, for example, in Japanese Laid-Open Patent Publication (Kokai) No. 2003-142582.

Referring to FIG. 7, there is shown a pattern diagram of a fuse circuit described in the patent publication.

Circuit blocks 101 are disposed on one side of a fuse region. A plurality of fuses 106 are arranged symmetrically about a common wire 107. Fuses 106b, 106d, and 106f arranged relatively distant from the circuit blocks 101 are connected to the corresponding circuit blocks, respectively, via return wires 103.

Referring to FIG. 8, there is shown a layout plan view of the fuse circuit shown in FIG. 7.

A plurality of fuse wires 201 are arranged perpendicularly to a common wire 203. A return wire 202 is connected at one end of each of the fuse wires 201, with the fuse wires 201 and the corresponding return wires 202 arranged alternately.

Referring to FIG. 9, there is shown a cross-sectional view taken on line D-D of the fuse circuit shown in FIG. 8. The fuse wires 201 are formed by upper-layer wiring and the return wires 202 are formed by lower-layer wiring.

The fuse wires 201 are arranged so as to satisfy the positional relation of preventing a short circuit between the return wires and the fuse wires caused by scattering of material 300 of the fuse wires due to irradiation with a laser beam as shown in FIG. 10. In other words, the fuse wires 201 are arranged at a pitch A so as not to be damaged by a laser beam at the time of fuse cutting as shown in FIG. 8.

In addition, Japanese Laid-Open Patent Publication (Kokai) No. 2002-368094 discloses a technology of an arrangement of return wires just under a fuse element.

In a semiconductor memory device, there are various fuses on the current chip and the number of fuses thereon is increasing. Therefore, the ratio of the fuse area to the chip area is increasing. The layout, however, as shown in Japanese Laid-Open Patent Publication (Kokai) No. 2003-142582 has problems of a wide fuse pitch and a large fuse area.

Furthermore, in Japanese Laid-Open Patent Publication (Kokai) No. 2002-368094, it is necessary to cut a fuse layer surely in actual laser trimming. Therefore, wiring just under the fuse layer is irradiated with a laser beam immediately after the cutting, and thus there is an extremely high risk. Moreover, a fuse wire has such a problem that it spatters breaking a part of the surrounding insulating layer in the instant of being blown at a high temperature, thus adversely affecting return wires just under and close to it.

SUMMARY OF THE INVENTION

It is a main object of the present invention to provide a semiconductor device for reducing a fuse area and preventing an effect of laser trimming.

According to one aspect of the present invention, there is provided a semiconductor device, wherein wires corresponding to a plurality of fuse wires are arranged collectively in one place. Furthermore, the wires are arranged in multiple layers.

In the semiconductor device according to the present invention, the fuse wires are arranged at the first pitch in a region where the foregoing wires are arranged between adjacent fuse wires, and the fuse wires are arranged at a pitch narrower than the first pitch in a region where the foregoing wires are not arranged between adjacent fuse wires.

As set forth hereinabove, according to the semiconductor device of the present invention, the wires connected to the plurality of fuse wires are arranged collectively, thereby enabling the fuse wires to be arranged at the minimum wiring pitch. Furthermore, if the connected wires are arranged in two or more layers, the wires can be further collectively arranged.

With these features, the fuse pitch can be narrowed while preventing the connection wires from being damaged by a laser beam, thereby permitting a reduction in area of a fuse circuit.

DETAILED DESCRIPTION OF THE PREFERRED EMBODIMENTS

The preferred embodiments of the present invention will now be described in detail hereinafter with reference to the accompanying drawings in order to clarify the foregoing and other objects, features, and effects of the present invention.

Figure 1:
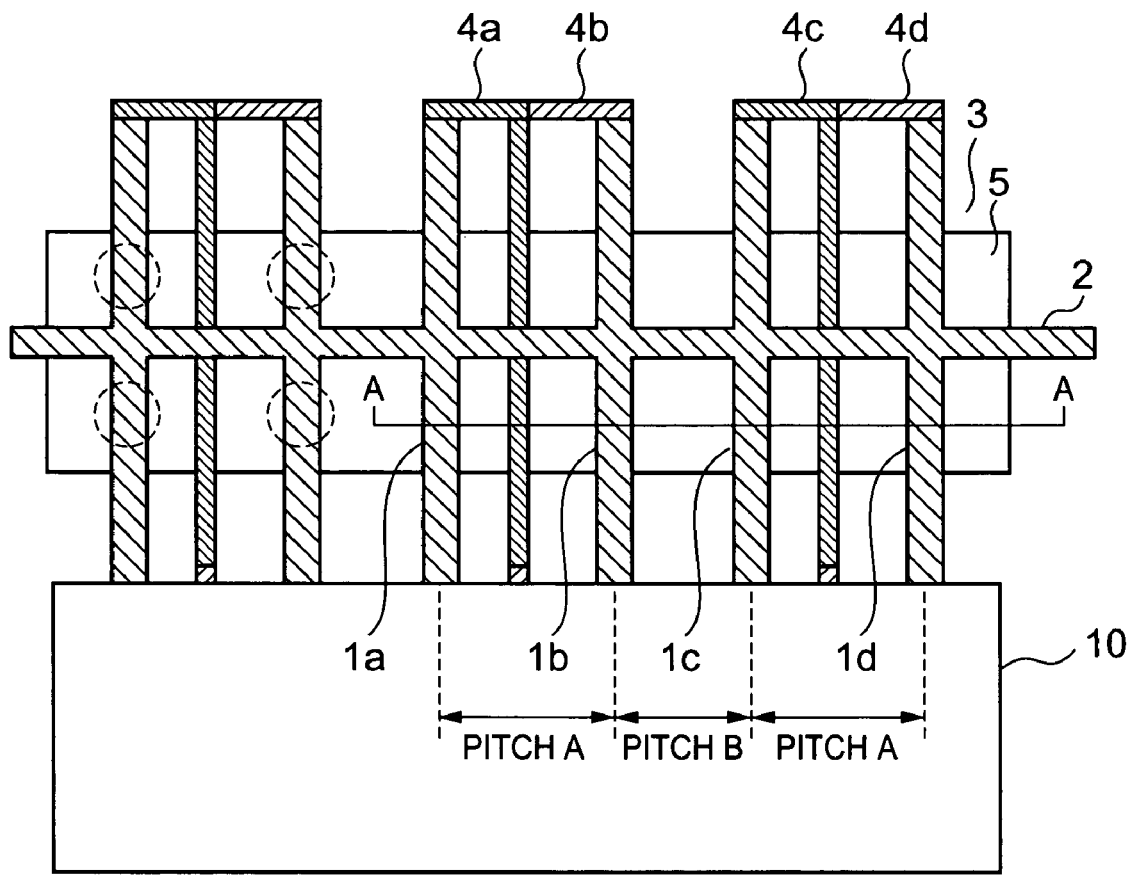
FIG. 1 is a diagram showing a semiconductor device according to the first embodiment of the present invention.
Figure 2:
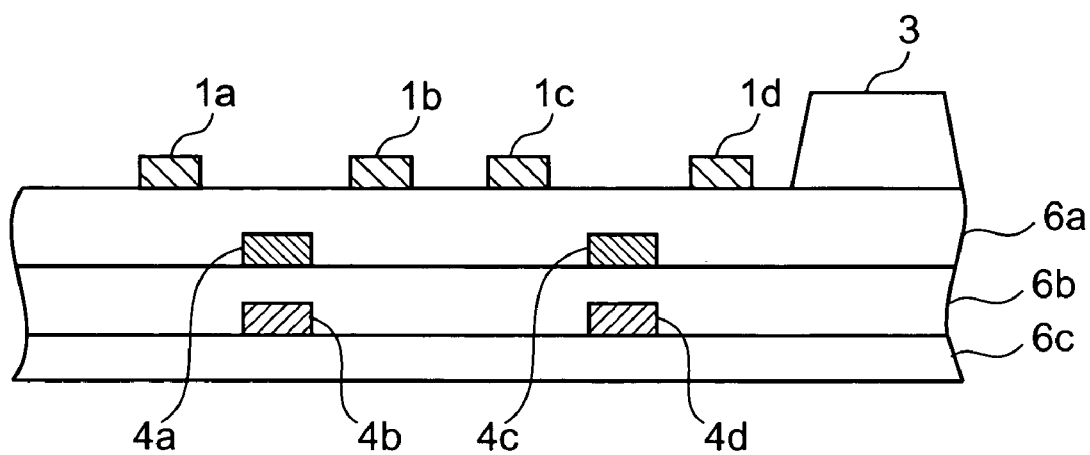
FIG. 2 is a diagram showing a cross section of the semiconductor device according to the first embodiment.

Referring to FIG. 1 and FIG. 2, there are shown diagrams of the first embodiment of the present invention.

FIG. 1 is a diagram showing a plan layout of a fuse circuit according to the first embodiment. FIG. 2 is a diagram showing a cross section taken on line A-A of FIG. 1.

Fuse wires 1 are arranged perpendicularly to a common wire 2 extending in a horizontal direction. The common wire 2 and the fuse wires 1 are formed by upper-layer aluminum or other metal wiring. The fuse wires 1a to 1d are connected at one end to corresponding circuit blocks (not shown) provided in a circuit block area 10 disposed on the side of one end. At the other end of the fuse wires 1a to 1d, they are correspondingly connected to return wires 4a to 4d, which are extending perpendicularly to the fuse wires 1 and arranged in such a way as to be located in parallel with the fuse wires and substantially centrally between the fuse wires. The return wires 4a to 4d are connection wires, which are connected to the corresponding circuit blocks provided in the circuit block area 10. The return wires are also the second wires formed from metal.

The return wires 4a and 4c are formed by the first lower-layer wiring underlying the upper-layer. The return wires 4b and 4d are formed by the second lower-layer wiring underlying the first lower-layer wiring. The return wires 4b and 4d are arranged just under the return wires 4a and 4c.

Figure 11:
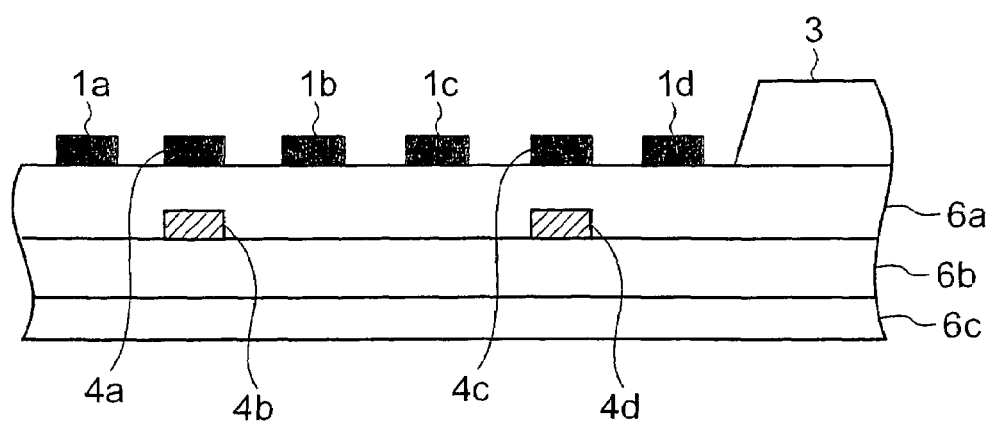
FIG. 11 is a diagram showing a cross section of the semiconductor device according to the fourth embodiment.

The return wires 4a and 4b are arranged in the same region between the adjacent fuse wires 1a and 1b and between 1c and 1d shown in FIG. 11. The return wires 4c and 4d are arranged in a region between the adjacent fuse wires 1c and 1d. The first and second lower-layer wires are embedded in insulating layers 6a to 6c. The fuse wires 1a to 1d are connected to the return wires 4a to 4d by plugs (not shown) embedded in corresponding contact holes.

A surface of the fuse region is covered with a cover film 3, with the fuses exposed from an opening 5 in the cover film 3. In other words, both ends of the fuse wires and both cross sections of the return wires are covered with the cover film 3. At the time of programming, the corresponding fuses are cut by irradiating circular portions indicated by a dotted line in FIG. 1 with a laser beam. In FIG. 1, 12 fuses are provided in one opening.

Due to no return wire provided between the fuse wires 1b and 1c, they can be arranged at the minimum wiring pitch B. On the other hand, a return wire is disposed between the fuse wires 1a and 1b and therefore they are arranged at a pitch A wider than the pitch B.

In this manner, the semiconductor device according to the first embodiment has the plurality of return wires arranged in the same region. This creates regions where no return wire is disposed and fuses can be arranged at the minimum fuse pitch. Moreover, the return wires are arranged in multiple layers.

Therefore, for example, if the current fuse pitch B is assumed to be 1, the pitch A for an arrangement in which the return wires are disposed inside the fuse cover need be approx. 1.6 to prevent a laser damage at fuse cutting. When adopting the fuse pitches like those in this embodiment, value 2.6 of the pitch A plus the pitch B is obtained. Considering that the conventional fuse pitch 3.2 obtained from pitch A*2, the fuse pitch can be narrowed by approx. 20%.

Furthermore, in this embodiment, the return wires are arranged not just under the fuse wires, but between the fuse wires, thereby securing an enough distance from the fuses. On the other hand, if the return wires are arranged just under the fuse wires, fuse wires need be cut surely in actual laser trimming and a laser beam immediately after the cutting involves a risk of directly impinging on the wires just under the fuse wires. Moreover, at the instant of being blown at a high temperature, the fuse wires may spatter breaking a part of the surrounding insulating layer, thereby involving a risk of adversely affecting the wires close to and just under the fuse wires.

The return wires are adopted in the present invention. This arrangement enables circuit regions to be put together in one place, thereby permitting a generation of common control signals and a reduction in wiring parasitic capacitance load and thus enabling a contribution to an acceleration in speed and a reduction in power.

Figure 3:
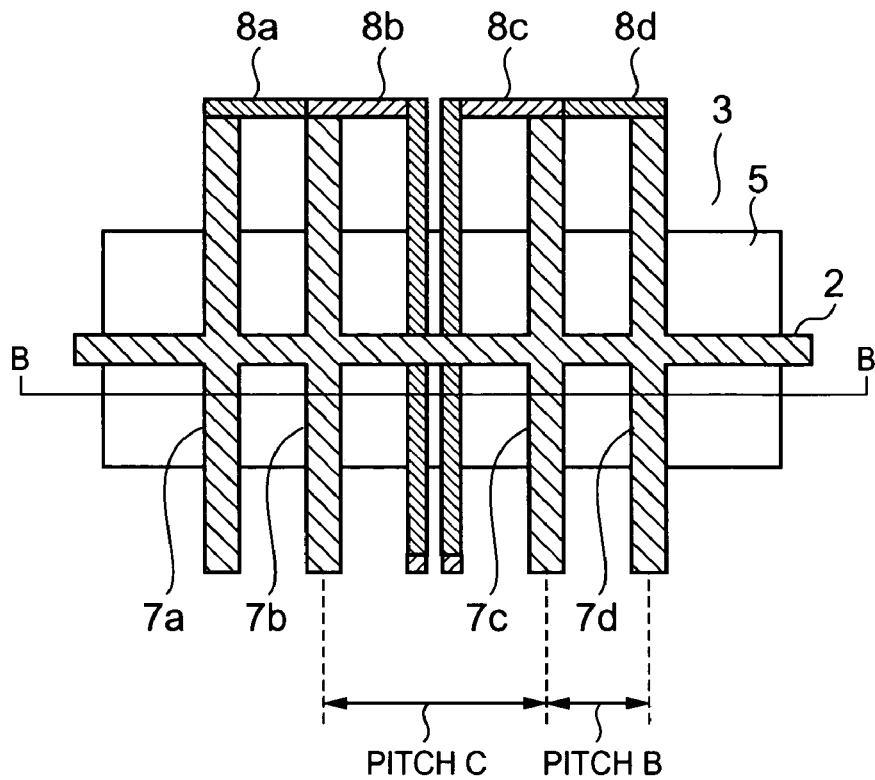
FIG. 3 is a diagram showing a semiconductor device according to the second embodiment of the present invention.
Figure 4:
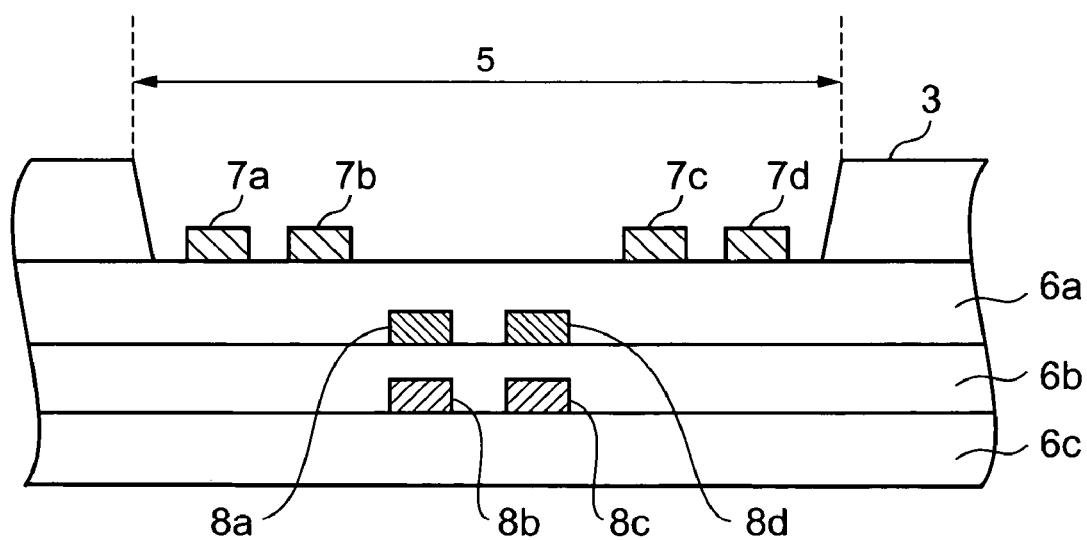
FIG. 4 is a diagram showing a cross section of the semiconductor device according to the second embodiment.

Referring to FIG. 3 and FIG. 4, there are shown diagrams of the second embodiment of the present invention.

FIG. 3 is a diagram showing a plan layout of a fuse circuit according to the second embodiment. FIG. 4 is a diagram showing a cross section taken on line B-B of FIG. 3.

In the second embodiment, return wires 8a to 8d corresponding to fuse wires 7a to 7d are arranged between the fuse wires 7b and 7c.

According to this embodiment, the four return wires 8a to 8d are arranged collectively in one place, thereby permitting an increase in area of the minimum pitch B and a reduction in area of the entire fuse in comparison with the first embodiment.

In the second embodiment, a plurality of (two in FIG. 3) fuses are arranged in one string and the strings are arranged in a plurality of stages (four stages in FIG. 3), with connection wires (wires 8a and 8b) for other fuse strings passing between adjacent fuse strings (between the fuse wires 7b and 7c). Moreover, other signal wires can be arranged in a region where the fuse wires 7b and 7c are arranged. For example, a signal wire supplied to another circuit can also be arranged just under or just over the wires 8a and 8b.

Figure 5:
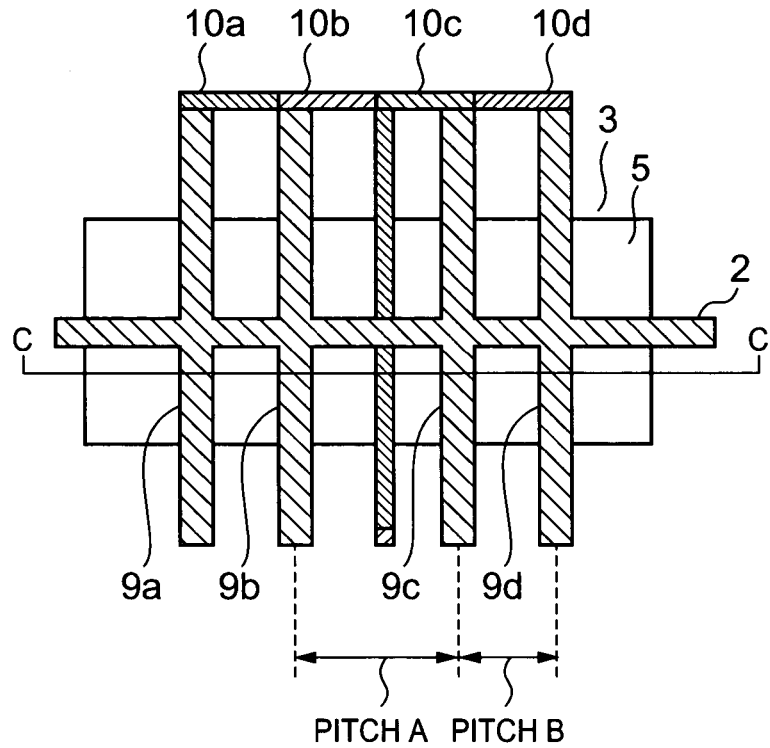
FIG. 5 is a diagram showing a semiconductor device according to the third embodiment of the present invention.
Figure 6:
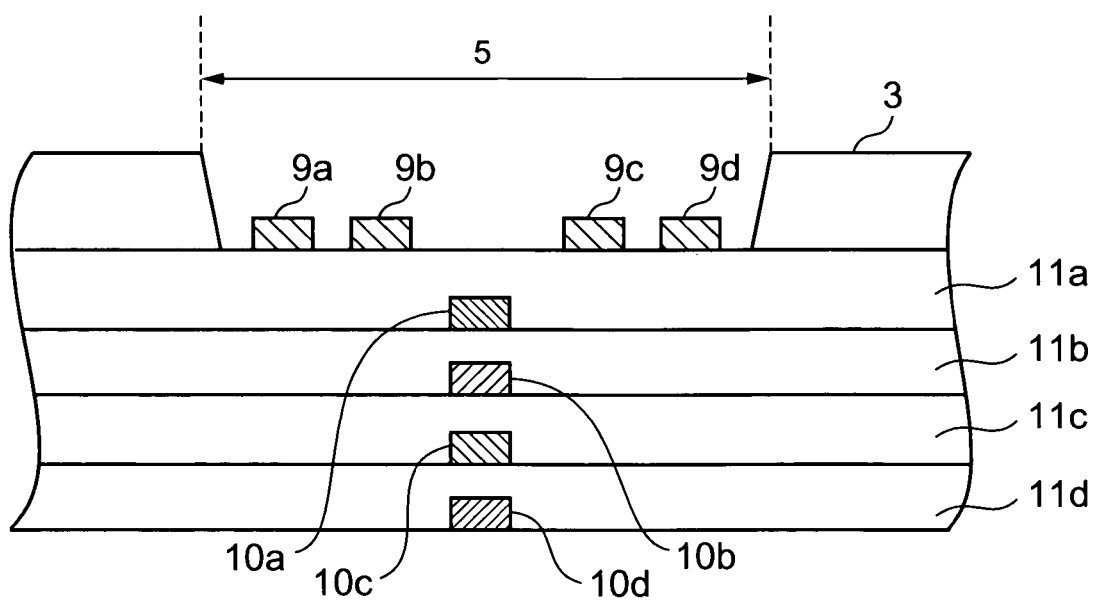
FIG. 6 is a diagram showing a cross section of the semiconductor device according to the third embodiment.
Figure 7:
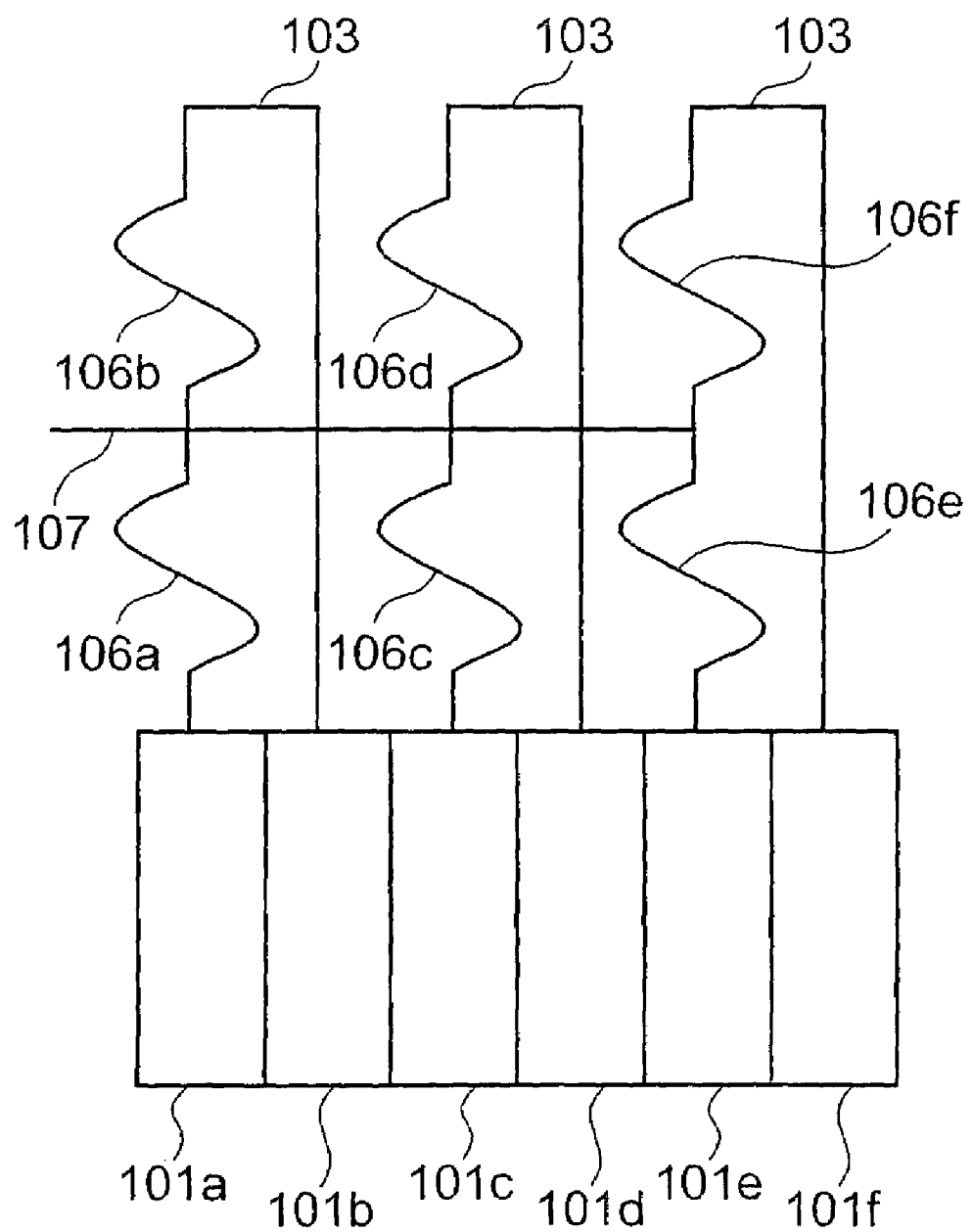
FIG. 7 is a diagram showing circuit blocks of a conventional semiconductor device.
Figure 8:
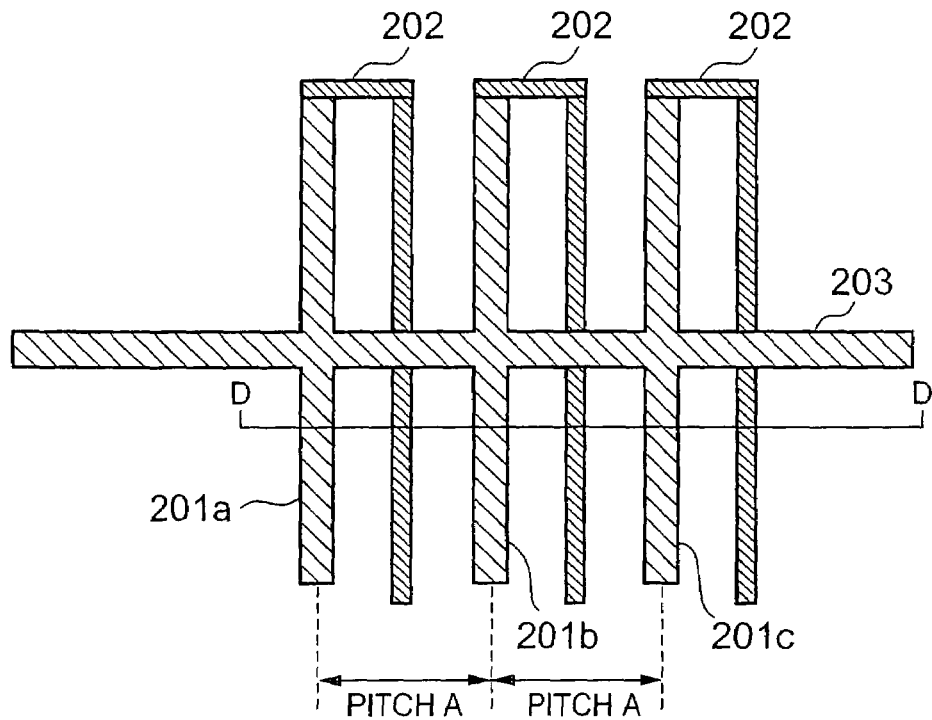
FIG. 8 is a diagram showing a plan layout of the conventional semiconductor device.
Figure 9:
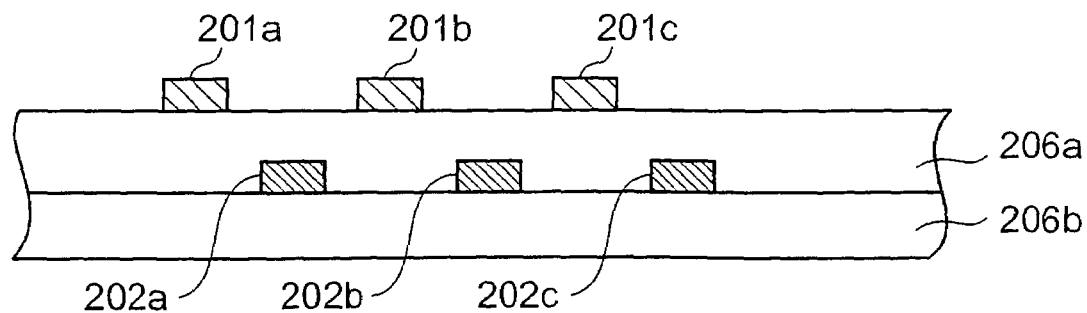
FIG. 9 is a diagram showing a cross section of the conventional semiconductor device.
Figure 10:
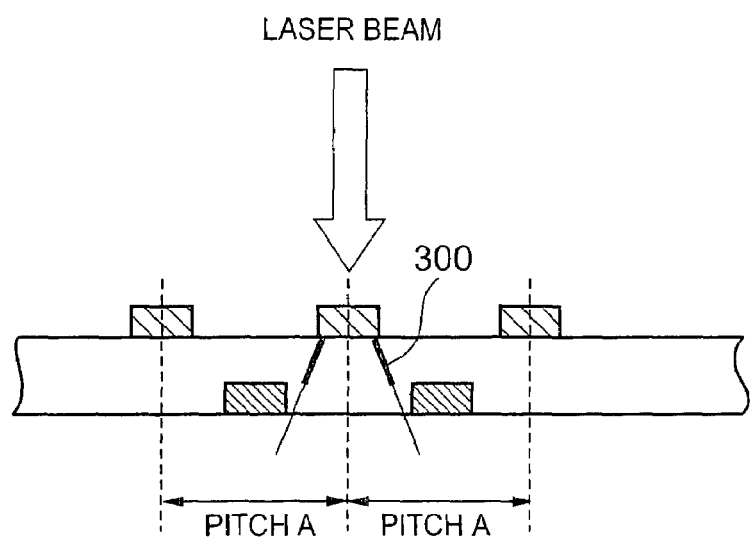
FIG. 10 is a diagram for explaining a positional relation on the layout of the conventional semiconductor device.

Referring to FIG. 5 and FIG. 6, there are shown diagrams of the third embodiment of the present invention.

FIG. 5 is a diagram showing a plan layout of a fuse circuit according to the third embodiment. FIG. 6 is a diagram showing a cross section taken on line C-C of FIG. 5.

In the third embodiment, return wires 10a to 10d corresponding to fuse wires 9a to 9d are arranged between the fuse wires 9b and 9c and further the return wires 10a to 10d are arranged in four layers.

According to the third embodiment, the pitch of the return wire section is smaller than in the second embodiment, thereby permitting a further reduction in area of the entire fuse.

It is to be understood that the present invention is not limited to those specific embodiments. On the contrary, it is apparent that the embodiments can be appropriately modified within the technical scope of the present invention.

For example, while the return wires are formed in different layers from the layer of the fuse wires in the embodiments, they can be formed in the same layer as the fuse wires. For example, in FIG. 2, the return wires 4a and 4c can be formed in the same layer as the fuse wires and between the fuse wires 1a and 1b, and the return wires 4b and 4d can be arranged in the places of the return wires 4a and 4c. The fuse wires and the return wires 4a and 4c are formed by using the same wiring layer. According to this arrangement, a difference in height between the return wires and the fuse wires is reduced, thereby permitting a reduction in effect of defocusing and spreading of a laser beam.

Moreover, two return wires 4a and 4b are arranged vertically in the first embodiment. They, however, can be arranged in parallel using the same underlying wiring layer, for example, like the return wires 8a and 8d in FIG. 4. In addition, the fuse wires need not be limited to metal wires, but, can be, for example, polysilicon wires. In other words, the fuse wiring only need be a conductive film that can be laser-trimmed. Furthermore, regarding the order of the return wire layers shown in FIG. 2, FIG. 4, and FIG. 6, no importance need be attached to the order shown in the foregoing embodiments.

What is claimed is:

1. A semiconductor device, comprising:
   a plurality of fuse wires arranged next to one another in a first direction, each of said fuse wires extending in a second direction; and
   a plurality of connection wires connected correspondingly to the plurality of fuse wires,
   wherein first and second connection wires of the plurality of connection wires are connected to an adjacent two of the fuse wires and are arranged to pass between the adjacent two of the fuse wires in the second direction and are overlapped with each other with an intervention of insulation therebetween.

2. The semiconductor device according to claim 1, wherein said connection wires are arranged in multiple layers.

3. The semiconductor device according to claim 1, wherein said fuse wires are arranged at a first pitch in a region where said connection wires are arranged between the adjacent fuse wires and said fuse wires are arranged at a pitch narrower than the first pitch in a region where said connection wires are not arranged between the adjacent fuse wires.

4. The semiconductor device according to claim 1, wherein said plurality of fuse wires and said plurality of connection wires are provided in one opening.

5. The semiconductor device according to claim 1, wherein said connection wires are arranged in a same pitch within a same layer.

6. A semiconductor device, comprising:
   a common wire;
   a plurality of first fuse wires arranged in a region on one side of said common wire;
   a plurality of second fuse wires arranged in a region on the other side of said common wire;
   circuit blocks arranged in the first region and connected to said fuse wires; and
   a plurality of return wires for connecting said circuit blocks to said plurality of second fuse wires correspondingly,
   wherein said plurality of first fuse wires are arranged at a first pitch and a second pitch narrower than the first pitch, without an arrangement of said return wires between the fuse wires arranged at the second pitch, but with an arrangement of said return wires between the fuse wires arranged at the first pitch, and
   wherein two of said return wires are connected respectively to an adjacent two of the second fuse wires, said two return wires pass between said adjacent two of the second fuse wires, and said two return wires are overlapped vertically with each other with respect to a substrate.

7. The semiconductor device according to claim 6, wherein said plurality of return wires are formed in layers different from said fuse wires.

8. The semiconductor device according to claim 6, wherein a part of said plurality of return wires are formed in the same layer as said fuse wires and wherein a remaining part of said plurality of return wires are formed in a different layer from said fuse wires.

9. A semiconductor device, comprising:
   a first wire provided in an extended condition in a first direction;
   first and second connection wires extending in a second direction perpendicular to said first direction, the first and second connection wires overlapping with each other in a vertical direction to a substrate with an intervention of insulation therebetween so that, in a plan view of the device, at least a part of one of said connection wires is behind another one of said connection wires; and
   second and third wires extending in the second direction and sandwiching the first and second connection wires therebetween, the second and third wires being electrically connected to the first and second connection wires respectively.

10. A semiconductor device, comprising:
    at least three fuse strings arranged in a plurality of stages; and
    at least three connection wires for supplying signals to said fuse strings in the plurality of stages, respectively,
    wherein said at least three connection wires are arranged in a region between an adjacent two of the at least three fuse strings and said at least three connection wires are overlapped with one another in a vertical direction to a substrate.

11. The semiconductor device according to claim 10, wherein,
    said fuse strings are arranged in a first direction,
    each of said fuse strings runs in a second direction, and
    said connection wires run in said second direction.

* * * * *